United States Patent
Sciancalepore

(10) Patent No.: US 11,418,009 B2
(45) Date of Patent: Aug. 16, 2022

(54) LIGHT EMISSION DEVICE COMPRISING AT LEAST ONE VCSEL AND A SPREAD LENS

(71) Applicant: COMMISSARIAT A L'ENERGIE ATOMIQUE ET AUX ENERGIES ALTERNATIVES, Paris (FR)

(72) Inventor: Corrado Sciancalepore, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 133 days.

(21) Appl. No.: 16/978,023

(22) PCT Filed: Mar. 6, 2019

(86) PCT No.: PCT/FR2019/050501
§ 371 (c)(1),
(2) Date: Sep. 3, 2020

(87) PCT Pub. No.: WO2019/171003
PCT Pub. Date: Sep. 12, 2019

(65) Prior Publication Data
US 2021/0006041 A1 Jan. 7, 2021

(30) Foreign Application Priority Data
Mar. 8, 2018 (FR) ...................... 1851995

(51) Int. Cl.
*H01S 5/183* (2006.01)
*H01S 5/343* (2006.01)

(52) U.S. Cl.
CPC ...... *H01S 5/18388* (2013.01); *H01S 5/18311* (2013.01); *H01S 5/3432* (2013.01); *H01S 2301/16* (2013.01); *H01S 2301/185* (2013.01)

(58) Field of Classification Search
CPC ............. H01S 5/18386; H01S 5/18388; H01S 5/18391; H01S 5/18394; H01S 2301/16; H01S 2301/18–185; H01S 5/42–426
See application file for complete search history.

(56) References Cited

U.S. PATENT DOCUMENTS

| 4,023,993 | A | * | 5/1977 | Scifres | ................ | H01L 33/0025 |
| | | | | | | 438/494 |
| 4,743,083 | A | * | 5/1988 | Schimpe | ................ | H01L 31/108 |
| | | | | | | 257/E31.128 |

(Continued)

FOREIGN PATENT DOCUMENTS

| CN | 101091293 A | * | 12/2007 | ............. | H01S 5/183 |
| CN | 106329313 A | * | 1/2017 | ......... | H01S 5/18386 |

(Continued)

OTHER PUBLICATIONS

International Search Report dated Jul. 8, 2019 in PCT/FR2019/050501 filed on Mar. 6, 2019, 2 pages.

*Primary Examiner* — Joshua King
(74) *Attorney, Agent, or Firm* — Oblon, McClelland, Maier & Neustadt, L.L.P.

(57) ABSTRACT

A light-emitting device includes a vertical-cavity surface-emitting laser, the resonant cavity of which is transverse multimode supporting transverse modes having rotational symmetry of order two about a main optical axis, and an index-contrast grating including a plurality of pads. The pads include: a central pad, a plurality of peripheral pads, which are periodically arranged along one or more lines that are concentric with respect to the central pad, and which are arranged so that the grating has, with respect to the main optical axis, a rotational symmetry of uneven order higher than or equal to three.

12 Claims, 3 Drawing Sheets

(56) References Cited

U.S. PATENT DOCUMENTS

| | | | | |
|---|---|---|---|---|
| 5,073,041 A * | 12/1991 | Rastani | ............... | H01S 5/423 |
| | | | | 372/101 |
| 5,115,442 A * | 5/1992 | Lee | ............... | H01S 5/18308 |
| | | | | 438/45 |
| 5,181,220 A * | 1/1993 | Yagi | ............... | H01L 33/20 |
| | | | | 257/97 |
| 5,426,657 A * | 6/1995 | Vakhshoori | ............... | H01S 5/18388 |
| | | | | 372/50.1 |
| 5,432,812 A * | 7/1995 | Kurobe | ............... | H01S 5/227 |
| | | | | 372/45.01 |
| 5,561,683 A * | 10/1996 | Kwon | ............... | H01S 5/18391 |
| | | | | 372/50.1 |
| 5,633,527 A * | 5/1997 | Lear | ............... | H01L 31/02327 |
| | | | | 372/50.23 |
| 5,703,896 A * | 12/1997 | Pankove | ............... | B82Y 20/00 |
| | | | | 372/50.23 |
| 5,861,636 A * | 1/1999 | Dutta | ............... | H01L 33/14 |
| | | | | 257/E33.07 |
| 5,940,422 A | 8/1999 | Johnson | | |
| 5,966,399 A * | 10/1999 | Jiang | ............... | H01S 5/18388 |
| | | | | 372/99 |
| 6,480,516 B1 * | 11/2002 | Shimizu | ............... | H01S 5/18305 |
| | | | | 359/344 |
| 6,990,135 B2 * | 1/2006 | Johnson | ............... | H01S 5/423 |
| | | | | 372/45.01 |
| 7,495,263 B2 * | 2/2009 | Kurahashi | ............... | H01L 33/22 |
| | | | | 257/E33.074 |
| 8,018,508 B2 * | 9/2011 | Toshikiyo | ............... | H01L 27/14625 |
| | | | | 359/566 |
| 2002/0085610 A1 | 7/2002 | Morgan | ............... | H01S 5/18308 |
| | | | | 372/99 |
| 2003/0002146 A1 * | 1/2003 | Shimizu | ............... | H01S 5/04254 |
| | | | | 359/344 |
| 2003/0185265 A1 * | 10/2003 | Henrichs | ............... | H01L 33/0045 |
| | | | | 257/E33.068 |
| 2004/0188695 A1 | 9/2004 | Morgan et al. | | |
| 2004/0191941 A1 | 9/2004 | Morgan et al. | | |
| 2004/0228379 A1 * | 11/2004 | Cox | ............... | H01S 5/18386 |
| | | | | 372/45.013 |
| 2005/0013334 A1 * | 1/2005 | Watanabe | ............... | H01S 5/02251 |
| | | | | 372/44.01 |
| 2005/0089075 A1 * | 4/2005 | Baba | ............... | H01S 5/18391 |
| | | | | 372/50.1 |
| 2006/0187997 A1 * | 8/2006 | Ezaki | ............... | H01S 5/3201 |
| | | | | 372/99 |
| 2007/0091965 A1 * | 4/2007 | Tanabe | ............... | H01S 5/1835 |
| | | | | 372/50.124 |
| 2007/0202622 A1 | 8/2007 | Baba et al. | | |
| 2007/0230529 A1 * | 10/2007 | Mochizuki | ............... | H01S 5/18386 |
| | | | | 372/46.01 |
| 2007/0242715 A1 * | 10/2007 | Gustavsson | ............... | H01S 5/18355 |
| | | | | 372/45.01 |
| 2007/0258499 A1 * | 11/2007 | Mochizuki | ............... | H01S 5/04253 |
| | | | | 372/50.1 |
| 2008/0037606 A1 | 2/2008 | Morgan et al. | | |
| 2008/0232418 A1 * | 9/2008 | Anan | ............... | H01S 5/0655 |
| | | | | 372/50.11 |
| 2012/0147912 A1 * | 6/2012 | Moench | ............... | H01S 5/1021 |
| | | | | 372/50.1 |
| 2013/0177336 A1 * | 7/2013 | Ikuta | ............... | H01S 5/18 |
| | | | | 399/221 |
| 2013/0221223 A1 * | 8/2013 | Caneau | ............... | G01N 21/59 |
| | | | | 250/340 |
| 2013/0223465 A1 * | 8/2013 | Uchida | ............... | H01S 5/227 |
| | | | | 372/50.12 |
| 2014/0079085 A1 * | 3/2014 | Song | ............... | H01S 5/2081 |
| | | | | 372/45.01 |
| 2014/0294030 A1 * | 10/2014 | Tamanuki | ............... | H01S 5/0653 |
| | | | | 372/50.11 |
| 2014/0321495 A1 * | 10/2014 | Fattal | ............... | H01S 5/18388 |
| | | | | 372/102 |
| 2017/0346257 A1 * | 11/2017 | Garnache-Creuillot | ............... | |
| | | | | H01S 5/18319 |

FOREIGN PATENT DOCUMENTS

| | | | | |
|---|---|---|---|---|
| CN | 111106533 A | * | 5/2020 | |
| DE | 4447765 C2 | * | 2/2002 | ............ B82Y 20/00 |
| JP | 2004119831 A | * | 4/2004 | |
| JP | 2012015139 A | * | 1/2012 | ......... H01S 5/18386 |
| KR | 20130063034 A | * | 6/2013 | |
| WO | WO-9320581 A1 | * | 10/1993 | ....... H01L 21/02178 |
| WO | WO-2010095297 A1 | * | 8/2010 | ............ H01L 33/22 |
| WO | WO-2016041993 A1 | * | 3/2016 | ........... H01S 3/0804 |

* cited by examiner

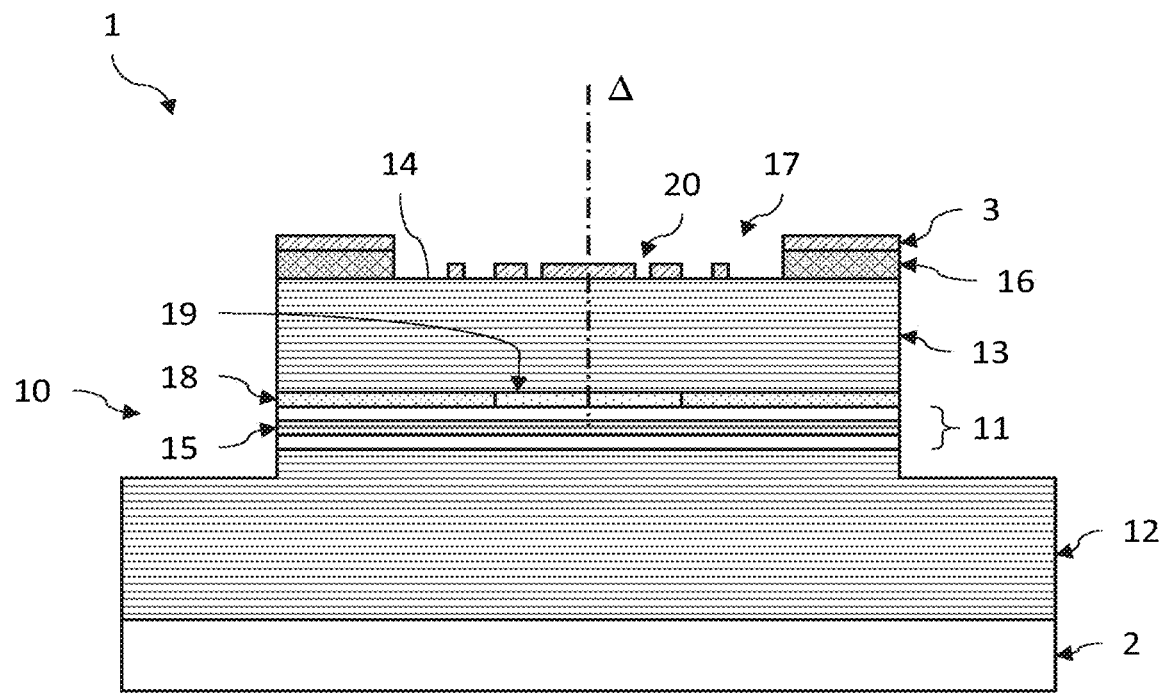
Fig.1
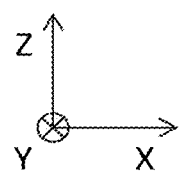

LIGHT EMISSION DEVICE COMPRISING AT LEAST ONE VCSEL AND A SPREAD LENS

TECHNICAL FIELD

The field of the invention is that of light-emitting devices comprising at least one vertical-cavity surface-emitting laser (VCSEL) which may be adapted to emit light radiation with a high optical power in the domain of the visible or of the near infrared, about 900 nm for example. Such an emitting device may be used to light a scene or for laser range-finding (LiDAR), inter cilia, notably in the automotive field or that of mobile telephony, or even that of virtual/augmented reality.

PRIOR ART

VCSEL-based light-emitting devices may comprise at least one VCSEL associated with a diffusion lens adapted to ensure the light beam generated by the VCSEL is formed with a desired emission pattern. This is notably the case with three-dimensional scanners, inter alia, which may comprise a matrix array of VCSELs each VCSEL of which is associated with a plano-convex microlens made of polymer, the microlenses possibly being assembled with the VCSEL matrix array via a step of picking and placing the microlenses, one after the other, on the VCSELs.

However, a process for fabricating such light-emitting devices notably requires the six axes of adjustment of the relative position of each microlens with respect to the corresponding VCSEL to be able to be precisely controlled, positioning errors being liable to degrade the emission pattern.

The publication by Moench et al. entitled *VCSEL based sensors for distance and velocity*, 2016, Proc. of SPIE, Vol. 9766, 97660A, describes an example of a light-emitting device comprising a VCSEL matrix array to which is fastened a matrix array of plano-convex microlenses made in a single piece from the same polymer layer (wafer-level process). Thus, such a fabrication process has a better performance in so far as the microlenses are fastened by means of a single pick-and-place step. The risk of error in the positioning of the microlenses is thus decreased.

However, there is a need to provide a light-emitting device comprising at least one VCSEL associated with a diffusion lens, the VCSEL being able to emit a light beam with a high optical power, the fabrication process of which has an even better performance notably in terms of simplicity, of cost and/or of the precision with which the diffusion lens is positioned, in order to obtain the sought emission pattern.

SUMMARY OF THE INVENTION

The objective of the invention is to at least partially remedy the drawbacks of the prior art, and more particularly to provide a light-emitting device that comprises a VCSEL associated with a diffusion lens, the VCSEL being capable of delivering a high optical power, the fabrication process of this device being able to be high-performance.

One aim of the invention is also to provide a light-emitting device the VCSEL of which is adapted to be able to deliver a high optical power, and the diffusion lens of which is adapted to transmit the light beam generated by the VCSEL with a desired emission pattern, the angular distribution of the light intensity of this device being substantially uniform, and potentially exhibiting symmetry of revolution. The light beam emitted by the emitting device may then exhibit little or no astigmatism.

To this end, one subject of the invention is a light-emitting device for emitting a light beam, comprising a vertical-cavity surface-emitting laser comprising a resonant cavity that extends along a main optical axis and that is bounded by two mirrors a top mirror of which defines an emission surface, the resonant cavity being adapted to support a plurality of transverse optical modes, including a fundamental transverse mode and transverse modes of higher order having a rotational symmetry of order two about the main optical axis.

According to the invention, the emitting device furthermore comprises an index-contrast grating forming a diffusion lens, said grating being arranged on the emission surface and comprising a plurality of pads that are separate from one another and that are made of at least one material of a first refractive index, said pads being encircled by a medium of a second refractive index different from the first index, said pads including:
  a central pad, which is centered on the main optical axis, and
  a plurality of peripheral pads, which are periodically arranged along one or more lines that are concentric with respect to the central pad, and which are arranged so that the grating has, with respect to the main optical axis, a rotational symmetry of uneven order higher than or equal to three.

The following are certain preferred but non-limiting aspects of this light-emitting device.

For a concentric line said to be of rank 1 arranged facing the central pad, a radial period may be defined as being a distance along a radial axis between an external radial border of a peripheral pad with respect to a radial border of the central pad. An azimuthal period may be defined as being the period of the periodic arrangement of the peripheral pads along said concentric line of rank 1. The radial period and the azimuthal period may be longer than or equal to $\lambda_e/n_{eff}^1$, where $\lambda_e$ is the wavelength of the light beam generated by the laser, and $n_{eff}^1$ is an effective index of a longitudinal mode of wavelength $\lambda_e$ and guided by the grating.

The emitting device may comprise a concentric line said to be of rank 2 arranged so as to encircle the concentric line of rank 1. The concentric lines of rank 1 and of rank 2 are then separate from each other. A radial period may be defined as being a distance along a radial axis between an external radial border of a peripheral pad of the concentric line of rank 2 with respect to an external radial border of a peripheral pad of the concentric line of rank 1. An azimuthal period may be defined as being the period of the periodic arrangement of the peripheral pads along said concentric line of rank 2. The radial period and azimuthal period that are associated with the concentric line of rank 2 may be longer than or equal to the radial period and azimuthal period that are associated with the concentric line of rank 1, respectively.

The radial period and azimuthal period that are associated with a concentric line of rank i may be longer than or equal to the wavelength $\lambda_e$.

The grating may comprise at least two concentric lines, said to be of rank 1 and 2, which are separate from each other, the peripheral pads of the concentric line of rank 2 being arranged so as to have an azimuthal offset with respect to the peripheral pads of the concentric line of rank 1.

The peripheral pads of the concentric line of rank 2 may be arranged in phase opposition with the peripheral pads of the concentric line of rank 1.

The resonant cavity may comprise a diaphragm defining an optical aperture a lateral dimension of which is larger than or equal to the wavelength $\lambda_e$ of the light beam generated by the laser.

The central pad may have a lateral dimension larger than or equal to half, to within 10%, of a lateral dimension of the optical aperture.

The central pad and the optical aperture may have a circular shape. The laser may take the form of a mesa a cross section of which is circular.

The index contrast between the first refractive index and the second refractive index may be smaller than or equal to 1.

The pads may have a thickness equal to an uneven multiple of $\lambda_e/(4 \cdot n_H)$, where $\lambda_e$ is the wavelength of the light beam generated by the laser and $n_H$ is the refractive index of the pads. The index-contrast grating advantageously has a local thickness equal to an uneven multiple of $\lambda_e/(4 \cdot n_H)$. Thus, the reflectivity of the top mirror is not substantially modified by the presence of the index-contrast grating. The grating therefore influences little or not at all the transverse modes present in the optical cavity.

The invention also relates to a process for fabricating the emitting device according to any one of the preceding features, the process comprising a step of wafer-scale production of a matrix array of lasers that are identical to one another, a step of conformal deposition of a passivation layer on the emission surface of the lasers, then a step of wafer-scale production of the index-contrast gratings by localized etching of the passivation layer.

BRIEF DESCRIPTION OF THE DRAWINGS

Other aspects, aims, advantages and features of the invention will become more clearly apparent on reading the following detailed description of preferred embodiments thereof, which description is given by way of non-limiting example, with reference to the appended drawings, in which:

FIG. 1 is a schematic and partial view, in cross section, of a light-emitting device according to one embodiment comprising a VCSEL and an index-contrast grating forming a planar diffusion lens;

DETAILED SUMMARY OF PARTICULAR EMBODIMENTS

Figure 2A:
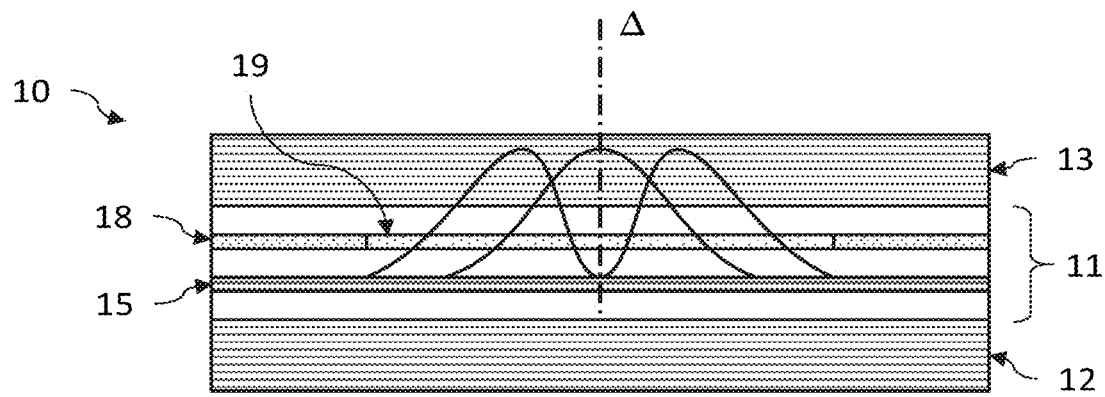
FIG. 2A is a schematic cross-sectional view of a portion of the emitting device shown in FIG. 1, illustrating at the optical aperture a fundamental transverse mode and a transverse mode of higher order.

In the figures and in the rest of the description, the same references have been used to designate elements that are identical or similar. In addition, the various elements are not shown to scale for the sake of clarity of the figures. Moreover, the various embodiments and variants are not exclusive of one another and may be combined together. Unless otherwise indicated, the terms "substantially", "about" and "of the order of" mean to within 10%. Moreover, the expression "comprising a" must be understood to mean "comprising at least one", unless otherwise indicated.

The invention generally relates to a light-emitting device comprising a vertical-cavity surface-emitting laser (VCSEL) and a planar diffusion lens ensuring the light beam generated by the VCSEL is formed with a preset emission pattern. The acronym VCSEL will be used in the rest of the description.

The VCSEL is adapted to be able to deliver a high optical power. As will be detailed below, this means that its resonant cavity supports a plurality of transverse optical modes, i.e. supports the fundamental transverse mode and transverse modes of higher order.

The diffusion lens is said to be planar in the sense that it is formed by an index-contrast grating. The grating is dimensioned so as to obtain the emission pattern sought for the light beam emitted by the emitting device. More precisely, the emission pattern has a substantially uniform symmetry of revolution, in the sense that it exhibits little or no optical astigmatism, even though the resonant cavity is adapted to support a plurality of transverse optical modes, the latter possibly additonally having a TE (transverse electric) and/or TM (transverse magnetic) polarization.

The laser is preferably adapted to emit a light beam centered on an emission wavelength $\lambda_e$ comprised in the visible or the near infrared, for example around 900 nm. Moreover, the emission pattern, or diffusion cone, represents the angular distribution of the intensity of the light beam emitted by the emitting device about a main diffusion axis.

FIG. 1 is a schematic and partial view in cross section of a light-emitting device 1 according to one embodiment. The emitting device 1 comprises at least one vertical-cavity surface-emitting laser (VCSEL) 10 and one index-contrast grating 20 forming a planar diffusion lens.

An orthogonal three-dimensional direct coordinate system (X,Y,Z), the X- and Y-axes of which form a plane parallel to the main plane of the grating 20 and to the emission surface 14 of the VCSEL, and the Z-axis of which is oriented in the direction of light emission, is defined here; this coordinate system will be referred to in the rest of the description. In the rest of the description, the terms "bottom" and "top" are to be understood to be relative to positions of increasing height in the +Z-direction.

The VCSEL 10 comprises a Fabry-Pérot resonant cavity 11 bounded by two reflectors, here two Bragg mirrors 12, 13, and a gain medium 15 located in the resonant cavity 11. It is adapted to generate a light beam of emission wavelength $\lambda_e$, the latter being defined, to the first order, by the dimension of the resonant cavity 11 and the refractive index of the one or more semiconductor compounds that form it. By way of example, the emission wavelength $\lambda_e$ may be located in the visible or in the near infrared, and for example may be equal to about 940 nm.

The Bragg mirrors 12, 13 are formed from an alternation of quarter-wave semiconductor layers respectively having a high refractive index and a low refractive index. The quarter-wave semiconductor layers may be made, purely by way of illustration, from the semiconductor compounds GaAs and AlAs, and alloys thereof. Thus, the quarter-wave semiconductor layers may be made of GaAs and of AlGaAs. The refractive index of AlAs is 2.9 in the domain of the near infrared and that of GaAs is 3.5. The semiconductor compound $Al_xGa_{1-x}As$ thus has a refractive index comprised between 2.9 and 3.5 depending on the aluminum context x.

The number of quarter-wave semiconductor layers is sufficient to obtain a high reflectivity for the Bragg mirrors 12, 13 at the emission wavelength $\lambda_e$, for example of the order of 99.9%. This reflectivity is much higher than in the case of a stripe laser in so far as, in a VCSEL 10, the gain of the gain medium 15 is low since the light beam passes therethrough at right angles.

In this example, the VCSEL 10 comprises a bottom Bragg mirror 12 made of GaAs/AlGaAs and resting on a substrate 2, which here is made of GaAs; a resonant cavity 11, here made of AlGaAs and comprising a gain medium 15 formed from a plurality of quantum wells here made of InGaAs; and a top Bragg mirror 13 made of GaAs/AlGaAs. In addition, the substrate 2 and the bottom Bragg mirror 12 are here doped a first conductivity type, n-type for example. The top Bragg mirror 13 is doped a second conductivity type opposite the first type, here p-type.

Electrical contacts are produced so as to allow the VCSEL 10 to be biased electrically. Thus, a bottom electrical contact (not shown) may be deposited in ohmic contact with the substrate 2, for example on the bottom face of the latter. A top electrical contact 16 is deposited on the top face of the top Bragg mirror 13. Each electrical contact may be made of one or more metal layers, for example layers of gold, and comprise a layer of platinum, titanium or nickel, in order to improve the adhesion of the electrical contact to the Bragg mirror 13 and/or to form a diffusion barrier.

The top electrical contact 16 has an annular, and for example circular, shape on the top face of the Bragg mirror 13, so as to permit the transmission out of the VCSEL 10 of the light beam generated in the resonant cavity 11. The region of the top face not covered by the electrical contact thus forms an emission surface 14 and defines an electrical aperture 17 of the VCSEL 10.

With the aim of decreasing the threshold current of the VCSEL 10, an annular dielectric layer 18 may be formed in the resonant cavity 11, this layer for example being located between the quantum wells and the top mirror 13. The annular dielectric layer 18 is made of an electrically insulating material, and for example of aluminum oxide $AlO_x$. The internal region bounded by the annular dielectric layer 18 defines an optical aperture 19 of the VCSEL 10. The annular dielectric layer 18 allows current lines to be concentrated and thus current density to be increased, thus decreasing the operating threshold of the VCSEL 10. It also forms a diaphragm 18 or a waveguide that ensures optical confinement via refractive-index variation.

The annular dielectric layer 18 may be formed in a conventional way by oxidation of an epitaxially grown layer of AlGaAs with a high aluminum content, after etching of the sidewalls of the top mirror 13 and of the resonant cavity 11 to obtain for the VCSEL 10 the mesa form shown in FIG. 1. The structure thus obtained is then placed in a furnace under an oxidizing atmosphere, so that the layer made of AlGaAs with a high aluminum content gradually oxidizes starting from the sidewalls of the mesa structure. Since the wet oxidation reaction rate is known, said reaction is stopped when the annular dielectric layer 18 defines the sought optical aperture 19.

The optical aperture 19 and the dielectric aperture 17 are substantially coaxial and centered on a main optical axis Δ of the VCSEL 10, along which the light beam generated by the VCSEL 10 is emitted. In this example, the mesa of the VCSEL 10 is of circular cross section and the optical and electrical apertures are also circular. However, the cross section of the mesa of the VCSEL 10 may be of other shapes, for example a square shape or more broadly of a polygonal shape, centered on the main optical axis Δ.

Alternatively, the optical aperture 19 may be defined, not by the annular dielectric layer, but by an annular region formed by localized ion implantation of ($H^+$, $O^+$, $N^+$ or $F^+$) ions so to ensure optical confinement by gain guiding on the one hand, and by curvature of the current lines, decreasing threshold current, on the other hand.

As mentioned above, the VCSEL 10 is adapted to be able to deliver a high optical power, such as, for example, a power higher than or equal to 4 mW. Now, optical power is directly proportional to the size of the optical aperture 19 in the XY-plane. Thus, the optical aperture 19 has a large size with respect to the emission wavelength $\lambda_e$, the VCSEL 10 as a result then being transverse multimodal as explained below. The resonant cavity 11 of the VCSEL 10 is therefore adapted to support a plurality of transverse optical modes.

To start with it will be recalled that a VCSEL 10 supports only a single longitudinal optical mode. Specifically, its free spectral range is far greater than the width of the gain curve of the gain medium 15. In contrast, it may support a plurality of transverse optical modes when, as known, the size of the optical aperture 19 in the XY-plane is large with respect to the emission wavelength $\lambda_e$. By way of example, for a wavelength $\lambda_e$ of 940 nm, the optical aperture 19 may have a size larger than or equal to 2 µm, or even than 2.5 µm, and preferably larger than or equal to 4 µm, or even than 5 µm. Thus, the optical modes supported in the resonant cavity 11 comprise a component parallel to the propagation axis (and therefore to the main optical axis Δ) and a transverse component related to the optical confinement, which is ensured here by the optical aperture 19.

FIG. 2A is a schematic cross-sectional view of a portion of the VCSEL 10 illustrated in FIG. 1. The resonant cavity 11 and a portion of the bottom and top mirrors 12, 13 are shown. The optical aperture 19 is defined by the internal perimeter of the annular dielectric layer 18.

In so far as the size of the optical aperture 19 in the XY-plane (for example, here its diameter) is large with respect to the emission wavelength $\lambda_e$, (for example it is equal to about 6 µm whereas $\lambda_e$ is equal to about 940 nm) a plurality of transverse optical modes are supported by the resonant cavity 11. In this example, the fundamental transverse mode and one transverse mode of higher order are shown.

Moreover, because the optical aperture 19 has a size, both along the X-axis and along the Y-axis, that is large with respect to the wavelength $\lambda_e$ notably here where the optical aperture 19 has a circular shape the diameter of which is of the order of several microns, the transverse optical modes may be polarized both in TE (transverse electric) mode and in TM (transverse magnetic) mode.

Figure 2B:
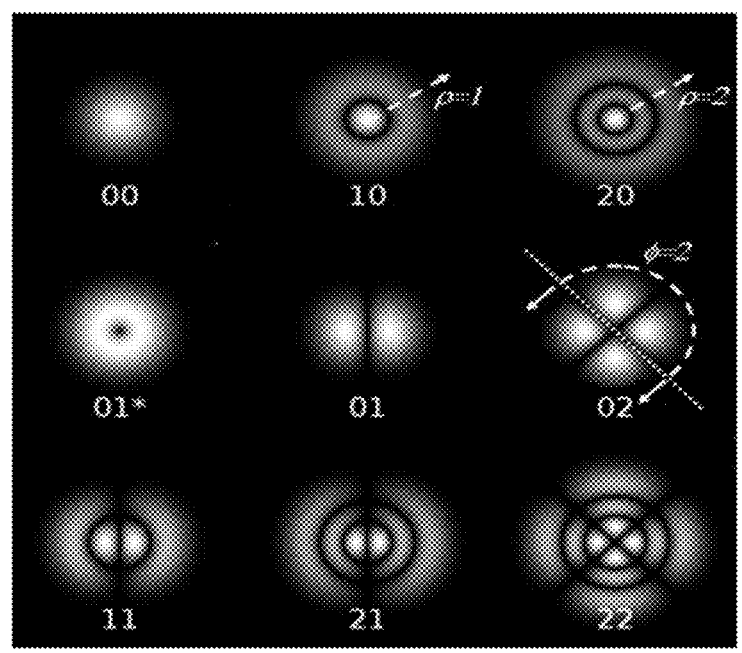
FIG. 2B illustrates the spatial distribution of the light intensity of the transverse modes supported by the resonant cavity of the VCSEL.

FIG. 2B is a view from above of the optical field of the various transverse modes that a VCSEL 10 of circular mesa such as illustrated in FIG. 1 is able to support. It may be seen that their spatial intensity distribution may be modelled by Laguerre-Gauss polynomials (as illustrated in FIG. 2B) or Hermite-Gauss polynomials. In the rest of the description, they are denoted (l,p), l indicating the radial order and p the azimuthal order, which correspond to the number of intensity nodes along the radial axis ρ and the azimuthal axis ϕ, respectively.

Thus, the transverse mode (0,0) is the fundamental mode. It comprises no intensity nodes along the radial axis ρ or along the azimuthal axis ϕ. Its spatial intensity distribution is of substantially Gaussian shape and therefore has a substantially axial symmetry about the main optical axis Δ.

The optical power of the light beam generated by the VCSEL 10 is notably conveyed by the fundamental transverse mode.

Moreover, the optical power of the light beam generated by the VCSEL 10 is also conveyed, non-negligibly, by the transverse modes of azimuthal order p equal to 1, namely the modes (0,1), (1,1) and (2,1). Now, as shown in FIG. 2B, these transverse modes of order p=1 have a rotational symmetry of order 2 about the main optical axis Δ. By rotational symmetry of order n, what is meant is a symmetry about the axis Δ of an angle of 360°/n. Thus, the spatial intensity distribution of each of the transverse modes (0,1), (1,1) and (2,1) is identical to itself after a rotation about the main optical axis Δ of an angle of 360°/2=180°.

Such transverse modes may be present in a VCSEL 10 the resonant cavity 11 of which notably has a cross section, in an XY-plane orthogonal to the main optical axis Δ, of a circular shape, or even of a polygonal shape such as a square shape.

The light-emitting device 1 has a preset emission pattern, i.e. the far-field intensity of the light beam emitted by the device 1 has a preset angular distribution about a main diffusion axis. This main diffusion axis substantially coincides with the main optical axis Δ of the VCSEL 10. The intensity peak is centered on the main diffusion axis and the half-maximum light intensity makes a preset non-zero diffusion angle.

In addition, the emission pattern has a substantially uniform angular light-intensity distribution. Moreover, the angular light-intensity distribution may not exhibit asymmetry of revolution, as a result of imperfections in the alignment of the optical and electrical apertures, this resulting in the emitted light beam having a low or even almost zero astigmatism. In other words, the angular distribution of the light intensity exhibits a substantially uniform symmetry of revolution, notably when the mesa of the VCSEL has a circular cross section, and when the optical aperture is circular. To this end, the emitting device 1 comprises a planar diffusion lens 20 adapted to form the light beam generated by the VCSEL 10 with such an emission pattern.

Figure 3A:
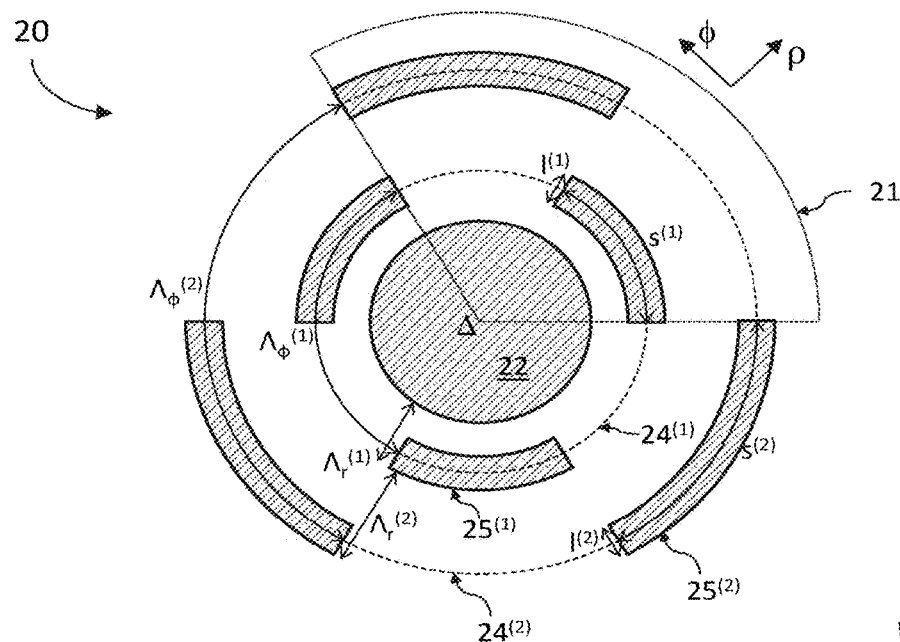
FIGS. 3A and 3B are schematic views from above of an index-contrast grating forming the planar diffusion lens of the emitting device according to one embodiment, FIG. 3B being a partial view of the grating illustrated in FIG. 3A.
Figure 3B:
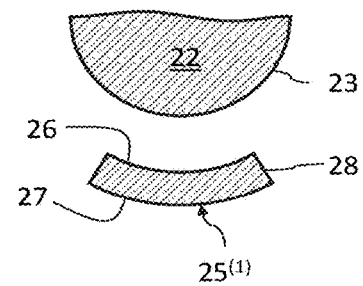
Figure 3C:
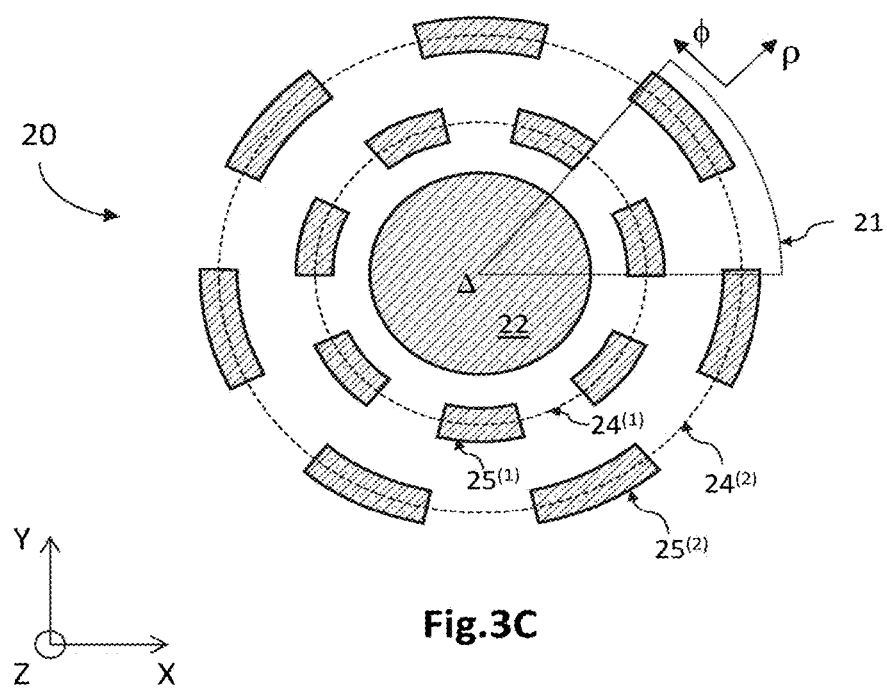
FIG. 3C is a schematic view from above of a variant of the index-contrast grating.

FIGS. 3A and 3C are schematic views, from above, of two variants of a planar diffusion lens of the emitting device 1 according to the embodiment illustrated in FIG. 1, FIG. 3B being a partial view of the grating 20 illustrated in FIG. 3A.

The planar diffusion lens is formed by an index-contrast grating 20 allowing the light beam generated by the VCSEL 10 to be formed so as to obtain the emission pattern described above, even though the light beam generated by the VCSEL 10 is conveyed by transverse optical modes such as the fundamental transverse mode and the transverse modes of azimuthal order p=1, and even though these transverse optical modes may have a TE and/or TM polarization.

The grating 20 comprises a plurality of pads 22, 25 that are made from at least one material of a first refractive index, here a high index $n_H$, and that are encircled by a medium of a second refractive index, here a low index $n_L$, different from the first index. Thus, in this example, the first index is higher than the second index, but, as a variant, the first index may be lower than the second index. The medium of low index $n_L$ may be formed from one or more materials and/or from gas or vacuum. The one or more materials of high index $n_H$ forming the pads and the medium of low index $n_L$ encircling the latter may be chosen so that the index contrast is relatively low, for example lower than or equal to about 1, or even to about 0.5, thus limiting optical losses during the transmission of the light beam generated by the VCSEL 10.

Thus, by way of example, the pads 22, 25 may be made of silicon nitride $SiN_x$ and be separated from one another by air or by silicon oxide $SiO_x$ or even be made of silicon oxide $SiO_x$ and be separated by air. Other materials of high refractive index may be used, such as dielectric materials like $CaF_2$ and ZnS taking the form of an alternation of sub-layers.

In addition, the grating 20 comprises a central pad 22 that is preferably centered on the main optical axis Δ, and a plurality of peripheral pads $25^{(i)}$, which are periodically arranged along at least one line $24^{(i)}$ that is concentric with the central pad 22, and which are placed so that the grating 20 has, with respect to the main optical axis Δ, a rotational symmetry of uneven order higher than or equal to three. "i" is the rank of the concentric line, with i=1 for the concentric line closest the central pad 22, and i=2, 3, . . . for the concentric lines that follow with increasing distance from the central pad 22. A concentric line $24^{(i)}$ is a line encircling the central pad 22 and having the same center as that of the central pad 22. Preferably, a concentric line $24^{(i)}$ runs parallel to the radial border 23 of the central pad 22. Moreover, each concentric line $24^{(i)}$ passes through the centroids of the cross sections of the associated peripheral pads $25^{(i)}$, in planes perpendicular to the XY-plane and passing through the main optical axis Δ.

The pads 22, 25 are separate from one another. They may optionally be joined to one another by a continuous thin layer of a high-index material having a thickness smaller than that of the pads. In other words, they may be formed by a partial or complete etch of a given layer made of at least one high-index material. Thus, the pads $25^{(i)}$ periodically arranged along a given concentric line $24^{(i)}$ are separate from one another. These peripheral pads $25^{(i)}$ are also separate from the central pad 22, and are separate from the peripheral pads $25^{(i-1)}$, $25^{(i+1)}$ periodically arranged along another concentric line. Thus, the material of high index of the grating 20 is discretized both along the radial axis ρ and along the azimuthal angle φ.

The grating 20 is placed on the emission surface 14, and is located in the electrical aperture 17 bounded by the top electrical contact 16. The pads 22, 25 may thus make direct contact with a quarter-wave semiconductor layer of the top Bragg mirror 13, or make contact with an interlayer made of a material different from those of the top mirror 13.

The central pad 22 is preferably centered on the main optical axis Δ, and is placed perpendicular to the optical aperture 19, preferably at the center of the electrical aperture 17. It has a dimension along the Z-axis, or thickness, that is substantially constant and that is preferably equal to an uneven multiple of $\lambda_e/(4 \cdot n_H)$ in order to perform an antireflection optical function. It has a cross section, in the XY-plane, of circular shape as illustrated in FIGS. 3A and 3B, but other shapes are possible, such as a square or polygonal shape. The shape of the central pad 22 in the XY-plane notably depends on that of the optical aperture 19 and on the shape of the mesa of the VCSEL 10. The central pad 22 is preferably circular when the optical aperture 19 is circular and when the shape of the mesa of the VCSEL 10 is circular. It may be square when this is also the case for the optical aperture 19 and for the shape of the mesa of the VCSEL 10. The dimension of the cross section, here the diameter, is preferably larger than or equal to half that of the optical aperture 19. Thus, for an optical aperture 19 of diameter equal to about 6 μm, the central pad 22 may have a diameter comprised between about 2.5 μm and 3.5 μm. Thus, the central pad 22 has a preponderant effect in the diffusion of the light beam transmitted by the grating 20 with respect to obtainment of the desired emission pattern.

The peripheral pads $25^{(i)}$ are periodically arranged along one or more concentric lines $24^{(i)}$. In FIGS. 3A and 3B, the grating 20 comprises two concentric lines $24^{(1)}$, $24^{(2)}$ that are separate from each other and that extend around the central pad 22. However, the grating 20 may comprise only a single concentric line, or more concentric lines. The concentric lines $24^{(i)}$ may extend longitudinally around the central pad 22 or, depending on the shape of the central pad 22, circularly or polygonally (for example so as to form a square). Thus, they may extend circularly or so as to form a square when the central pad 22 in the XY-plane is circular or square, respectively.

Each peripheral pad $25^{(i)}$ has an azimuthal dimension $s^{(i)}$, or length, and a radial dimension $l^{(i)}$, or width. The length $s^{(i)}$ is defined as being the distance separating the azimuthal borders 28 from each other, this distance being measured along the concentric line $24^{(i)}$. The width $l^{(i)}$ is defined as being the distance separating the internal and external radial borders 26, 27. Preferably, the length $s^{(i)}$ is larger than the width $l^{(i)}$, so that the longitudinal axis of each peripheral pad $25^{(i)}$ is oriented along the corresponding concentric line $24^{(i)}$. In addition, since the peripheral pads $25^{(i)}$ are here circular arcs extending around the central pad 22 of circular shape, the length $s^{(i)}$ is thus a curvilinear length.

Moreover, each peripheral pad $25^{(i)}$ has a thickness that is preferably identical for all the pads 22, $25^{(i)}$, and preferably identical to that of the central pad 22. The thickness of the peripheral pads $25^{(i)}$ is preferably equal to an uneven multiple of $\lambda_e/4 \cdot n_H$ in order to ensure an antireflection optical function is performed. Thus, the grating 20 forms a planar diffusion lens, in the sense that it is formed from a plurality of separate pads 22, $25^{(i)}$ the thickness of which is preferably identical for all the pads, and thus differs from the aforementioned plano-convex lenses. Thus, because the grating 20 has a local thickness equal to an uneven multiple of $\lambda_e/4 \cdot n_H$, it induces no disruption in the local reflectivity of the top mirror 13. In other words, the local reflectivity associated with an equivalent reflector formed from the top mirror 13 and the grating 20 is substantially equal to that of the top mirror 13, and remains spatially uniform. As a result thereof, the grating 20 thus has little or no influence on the transverse modes present in the optical cavity. Thus, the transverse modes are substantially all transmitted out of the optical cavity, this being particularly sought in the context of LiDAR or 3D-detection applications, inter alia.

The peripheral pads $25^{(i)}$ are arranged so that the grating 20 has a rotational symmetry of an uneven order n higher than or equal to three about the main optical axis Δ. Thus, the grating 20 is formed from a plurality of elementary features 21, formed by the pads $25^{(i)}$ and the spacings between the pads $25^{(i)}$, that are identical to one another after a rotation about the main optical axis Δ by an angle equal to 360°/n. The order n is higher than or equal to three, and is preferably equal to five or to seven, or to even more.

Thus, FIG. 3A illustrates an exemplary grating 20 the peripheral pads $25^{(i)}$ of which are periodically arranged along two concentric lines $24^{(1)}$, $24^{(2)}$ so that the grating 20 has a rotational symmetry of order three about the main optical axis Δ. The grating 20 therefore comprises three elementary features 21 that are separate from one another, and symmetric in rotation by an angle of about 360°/3=120° about the main optical axis Δ.

Moreover, FIG. 3B illustrates another exemplary grating 20 the peripheral pads of which are periodically arranged along two concentric lines $24^{(1)}$, $24^{(2)}$ so that the grating 20 exhibits a rotational symmetry of order seven about the main optical axis Δ. The grating 20 therefore comprises seven elementary features 21 that are separate from one another, and symmetric in rotation by an angle of about 360°/7=51° about the main optical axis Δ.

Thus, because the grating 20 is, on the one hand, not only discrete along the radial axis ρ but also along the azimuthal axis φ, and on the other hand, rotationally symmetric with an uneven order at least equal to three with respect to the main optical axis Δ, the emitting device 1 has an emission pattern such that the angular distribution of the light beam is substantially uniform. The light beam then has an astigmatism that is particularly low or even almost absent. The uniformity of the angular distribution of the light beam increases with the uneven order of the rotational symmetry of the grating 20, which is for example equal to five, or even to seven, or indeed more. Specifically, via this structure of the grating 20 and arrangement of the high-index pads 22, 25, the uniformity of the angular distribution of the effective index associated with the various transverse optical modes of the light beam generated by the VCSEL 10, namely the fundamental transverse mode and the transverse modes (0,1), (1,1) and (2,1) of azimuthal order p=1, is increased, independently of the TE and/or TM polarization state of these transverse modes. This increase in the uniformity of the angular distribution of the effective index contributes to making the angular distribution of the emission pattern substantially uniform, and notably to making the symmetry of revolution of the emission pattern substantially uniform, in particular when the grating 20, the optical aperture 19 and the shape of the mesa of the VCSEL are circular, and thus to limiting the presence of astigmatism in the light beam emitted by the emitting device 1.

Generally, the effective index $n_{eff}$ of a transverse optical mode of wavelength $\lambda_e$ of the VCSEL is defined as the product of the propagation constant β and of $\lambda_e/2\pi$. The propagation constant β depends on the wavelength $\lambda_e$ of the optical mode, and on the opto-geometric properties of the VCSEL. The effective index of the transverse optical mode corresponds, in a certain way, to the refractive index of the waveguide 'seen' by the optical mode.

In addition, it is advantageous, when the grating 20 comprises a plurality of concentric lines $24^{(i)}$, $24^{(i+1)}$, for the peripheral pads $25^{(i)}$, $25^{(i+1)}$ of two adjacent concentric lines to be periodically arranged so that the peripheral pads $25^{(i)}$ of a concentric line $24^{(i)}$ have an azimuthal offset with respect to the peripheral pads $25^{(i+1)}$ of the other concentric line $24^{(i+1)}$, and preferably, as illustrated in FIGS. 3A and 3B, to be arranged in phase opposition. This means that a radial axis $\rho^{(i+1)}$ passing through the centroid of a peripheral pad $25^{(i+1)}$ of rank i+1 is collinear with no radial axis $\rho^{(i)}$ passing through the centroid of a peripheral pad $25^{(i)}$ of rank i. In the case where the peripheral pads $25^{(i)}$, $25^{(i+1)}$ are arranged in phase opposition, this means that a radial axis $\rho^{(i+1)}$ makes the same angle to the radial axes $\rho^{(i)}$ of two adjacent peripheral pads of rank i. This relative arrangement of the peripheral pads of various concentric lines also tends to increase the uniformity of the angular distribution of the effective index associated with the various transverse modes (0,0), (0,1), (1,1) and (2,1), and thus to make the angular distribution of the emission pattern substantially uniform. The presence of the optical aberration of astigmatism in the emission pattern is moreover decreased or even prevented.

Moreover, radial and azimuthal periods $\Lambda_\rho^{(i)}$, $\Lambda_\phi^{(i)}$ associated with the peripheral pads $25^{(i)}$ are defined. The radial period $\Lambda_\rho^{(1)}$ associated with the first concentric line $24^{(1)}$ is defined as being the distance radially separating the radial border 23 of the central pad 22 with respect to the external radial border 27 of a first peripheral pad $25^{(1)}$. Each peripheral pad $25^{(i)}$ is bounded radially by an internal radial border 26 oriented toward the central pad 22, and by an external radial border 27 opposite the border 26. In addition, the radial period $\Lambda_\rho^{(2)}$ associated with the second concentric line $24^{(2)}$ is defined as being the distance radially separating the external radial border 27 of a peripheral pad $25^{(1)}$ of a concentric line of rank 1 with respect to the external radial border 27 of a peripheral pad $25^{(2)}$ of a concentric line of rank 2. Moreover, the azimuthal period $\Lambda_\phi^{(i)}$ associated with a concentric line $24^{(i)}$ of rank i is defined as being the length of a feature periodically repeating along the concentric line $24^{(i)}$, this feature being formed from a peripheral pad $25^{(i)}$ and from the spacing separating it from an adjacent peripheral pad $25^{(i)}$.

The radial and azimuthal periods $\Lambda_\rho^{(i)}$, $\Lambda_\phi^{(i)}$ are preferably longer than or equal to $\lambda_e/n_{e\!f\!f}$', where $\lambda_e$ is the wavelength of the light beam emitted by the emitting device 1, and $n_{e\!f\!f}$' is here an effective index of a guided longitudinal mode, of wavelength $\lambda_e$, propagating in the plane of the grating 20. To a first approximation, the effective index $n_{e\!f\!f}$' may be set equal to the average of the high refractive index $n_H$ and of the low refractive index $n_L$. Thus, the grating 20 has a high transmission at the emission wavelength $\lambda_e$, so that the transmission out of the VCSEL is substantially not degraded because of the presence of the grating 20. Specifically, as shown in the publication by Chang-Hasnain and Yang entitled *High-contrast gratings for integrated optoelectronics*, Adv. Opt. Photonics 4, 379-440 (2012), in the case of an incident wave of wavelength $\lambda_e$ propagating toward an index-contrast grating 20 formed from rectilinear strips of high refractive index arranged parallel to one another with a period $\Lambda$, the grating 20 enters a diffractive regime when the ratio $\lambda_e/\Lambda$ drops below about 1 because of the effective index of the guided mode, this resulting in a large decrease in the reflectivity of the grating 20 at the emission wavelength $\lambda_e$, and therefore in an increase in the transmission of the incident wave by the grating 20.

Thus, the radial period $\Lambda_\rho^{(i)}$ associated with a concentric line $24^{(i)}$ of rank i is longer than or equal to $\lambda_e/n_{e\!f\!f}$'. Preferably, the period $\Lambda_\rho^{(i+1)}$ of a concentric line $24^{(i+1)}$ of rank i+1 is longer than or equal to the period $\Lambda_\rho^{(i)}$ of the concentric line $24^{(i)}$ of rank i. By way of example, in the case of an emitting device 1 that emits at a wavelength $\lambda_e$ equal to about 940 nm, the radial period $\Lambda_\rho^{(1)}$ may be equal to about 1 μm, and the radial period $\Lambda_\rho^{(2)}$ may be equal to about 1.25 μm.

Moreover, the azimuthal period $\Lambda_\phi^{(i)}$ associated with a concentric line $24^{(i)}$ of rank i is longer than or equal to $\lambda_e/n_{e\!f\!f}$'. It is preferably longer than or equal to the radial period $\Lambda_\rho^{(i)}$. Preferably, the azimuthal period $\Lambda_\phi^{(i+1)}$ of a concentric line $24^{(i+1)}$ of rank i+1 is longer than or equal to $\Lambda_\phi^{(i)}$ of the concentric line $24^{(i)}$ of rank i. By way of example, for a wavelength $\lambda_e$ equal to about 940 nm, the azimuthal period $\Lambda_\phi^{(1)}$ may be equal to about 2 μm, and the azimuthal period $\Lambda_\phi^{(2)}$ may be equal to about 2.5 μm.

Moreover, the peripheral pads $25^{(i)}$ are preferably arranged and dimensioned so that the fill factor of the grating 20 decreases radially. The fill factor is associated with a given radial period $\Lambda_\rho^{(i)}$, and corresponds to the azimuthal average for $\phi$ ranging from 0° to 360° of the refractive index, for a region associated with the radial period $\Lambda_\rho^{(i)}$ in question. By way of illustration, the fill factor associated with the radial period $\Lambda_\rho^{(1)}$ is the average of the refractive index of the grating 20 for an annular region bounded radially by the radial border 23 of the central pad 22 and the external radial border 27 of the peripheral pads $25^{(1)}$ of the concentric line of rank 1. The fill factor is thus maximal for the central pad 22, then decreases for the radial period $\Lambda_\rho^{(1)}$ and further decreases for the radial period $\Lambda_\rho^{(2)}$. The radial decrease in the fill factor contributes to controlled transmission of the light beam with the desired emission pattern.

By way of example, the emitting device 1 may comprise at least one VCSEL 10 the resonant cavity 11 of which is bounded by two Bragg mirrors 12, 13 made of an alternation of quarter-wave semiconductor layers made of GaAs and AlGaAs. The gain medium 15 contains quantum wells made of InGaAs, and the VCSEL 10 is here adapted to generate a light beam the wavelength $\lambda_e$ of which is centered on 940 nm. The optical aperture 19 is formed by an aluminum-oxide diaphragm located between the gain medium 15 and the top mirror 13. The optical aperture 19 here has a circular shape of a diameter equal to about 6 μm. An electrical contact 16 that is gold-based rests on the top face of the Bragg mirror 13, and has a circular shape so as to define the electrical aperture 17 in which the emission surface 14 of the VCSEL 10 is located.

The index-contrast grating 20 is located in the electrical aperture 17 and rests on the emission surface 14. It is formed from a plurality of separate pads 22, 25 made of silicon nitride and separated laterally from one another by air. The grating 20 comprises a central pad 22 centered on the main optical axis $\Delta$, of circular shape and of diameter equal to about half of that of the optical aperture 19, here equal to about 3 μm. The grating 20 comprises peripheral pads $25^{(1)}$, $25^{(2)}$ that extend periodically along two concentric lines $24^{(1)}$, $24^{(2)}$ with respect to the central pad 22. The concentric lines $24^{(1)}$, $24^{(2)}$ have a circular shape and the peripheral pads $25^{(1)}$, $25^{(2)}$ a circularly arcuate shape. The peripheral pads $25^{(1)}$, $25^{(2)}$ are arranged so that the grating 20 here has, with respect to the main optical axis $\Delta$, a rotational symmetry of order 7.

Thus, the grating 20 comprises a concentric line $24^{(1)}$ of rank 1 on which are here arranged seven peripheral pads $25^{(1)}$ with an azimuthal period $\Lambda_\phi^{(1)}$ here equal to about 2 μm. The peripheral pads $25^{(1)}$ have a curvilinear length $s^{(1)}$ equal to about 1 μm and are spaced apart pairwise by a curvilinear distance of about 1 μm. They have a width $l^{(1)}$ equal to about 500 nm and the radial period $\Lambda_\phi^{(1)}$ is equal to about 1 μm. Thus, the internal radial border 26 of the peripheral pads $25^{(1)}$ is spaced apart from the radial border 23 of the central pad 22 by a distance of about 500 nm.

In addition, the grating 20 comprises a concentric line $24^{(2)}$ of rank 2 on which are here arranged seven peripheral pads $25^{(2)}$ with an azimuthal period $\Lambda_\phi^{(2)}$ here equal to about 2.5 μm. The peripheral pads $25^{(2)}$ have a curvilinear length $s^{(2)}$ equal to about 750 nm and have a width $l^{(2)}$ equal to about 500 nm for a radial period $\Lambda_\rho^{(2)}$ equal to about 1.25 μm. Thus, the internal radial border 26 of the peripheral pads $25^{(2)}$ is spaced apart from the external radial border 27 of the peripheral pads $25^{(1)}$ by a distance of about 750 nm. In addition, the peripheral pads $25^{(2)}$ of the concentric line $24^{(2)}$ of rank 2 are arranged so as to have an azimuthal offset with respect to the peripheral pads $25^{(1)}$ of the concentric line $24^{(1)}$ of rank 1, and more precisely a phase opposition with the latter.

Thus, because the grating 20 has a rotational symmetry of uneven order higher than or equal to three, here equal to seven, the grating 20 allows the fundamental transverse mode and the transverse modes of azimuthal order p=1 to be effectively transmitted and a desired emission pattern exhibiting substantially no astigmatism to be obtained, whatever the TE and/or TM polarization state of the transverse optical modes. The emission pattern then has a substantially uniform rotational symmetry. In addition, the arrangement in phase opposition of the peripheral pads $25^{(2)}$ of rank 2 with respect to those $25^{(1)}$ of rank 1 allows the angular distribution of the effective index around the main optical axis Δ to be improved and therefore participates in increasing the uniformity of the angular distribution of the emission pattern, or even in limiting the presence of an optical aberration such as astigmatism. Moreover, in so far as the radial and azimuthal periods are longer than or equal to $\lambda_e/n_{eff}'$, the transmission grating 20 has a good transmittance at the emission wavelength $\lambda_e$.

Studies using numerical simulations carried out by means of the software package RSoft-FullWave developed and distributed by Synopsys have allowed the optical behavior of a VCSEL 10 associated with the diffusion lens such as described above and a VCSEL 10 not comprising the same diffusion lens to be compared. They show that the emission pattern of the emitting device 1 comprising the grating 20 has an emission pattern having a substantially uniform symmetry of revolution and a half-maximum diffusion angle equal to about 20°, whereas the same angle is about 10° without the grating 20. The emitting device 1 according to the embodiment thus allows the sought emission pattern to be obtained. Moreover, the wavelength $\lambda_e$ of the generated light beam is not modified by the presence of the grating 20, in so far as it is of 941.6 nm for the emitting device 1 with the grating 20, and of 941.3 nm when the grating 20 is absent. In addition, the quality factor is 1500 for the emitting device 1 with the grating 20, whereas it is 1300 without the grating 20. Thus, the presence of such a grating 20 forming a diffusion lens does not modify the emission wavelength $\lambda_e$ and furthermore participates in decreasing optical losses associated with the transmission of the light beam generated by the VCSEL 10.

The light-emitting device 1 may comprise a VCSEL matrix array 10 each VCSEL 10 of which is covered with an index-contrast grating 20 forming a planar diffusion lens. The process for fabricating such a device advantageously comprises a step of wafer-scale production of the VCSELs 10, then a step of conformal deposition of a layer 3 of high refractive index on the top face of the Bragg mirror 13. This high-index layer 3 is preferably a passivation layer, for example one made of silicon nitride $SiN_x$, as a passivation layer is conventionally used to electrically insulate the top electrical contacts 16 from one another and to protect the top mirror 13. The fabrication process may then comprise a step of wafer-scale production of the gratings 20 associated with the VCSELs 10, by means of the conventional microelectronics techniques of photolithography and localized etching. This localized etching is preferably a partial or complete dry etch of the passivation layer 3.

Thus, the fabricating process has a better performance than that associated with the process of the aforementioned example of the prior art, in so far as it comprises no step of positioning and assembling a matrix array of microlenses that was produced beforehand from a polymer layer. The process thus has a lower cost and the risk of misalignment of the lenses with respect to the VCSELs 10 is decreased. In addition, in so far as the radial and azimuthal periods associated with the peripheral pads 25 are longer than or equal to $\lambda_e/n_{eff}'$, here longer than or equal to about 1 μm, the process is simplified in so far as it is not necessary to employ etching techniques allowing the localized etching to be carried out to particularly small dimensions, for example of the order of about ten nanometers. In addition, it is possible to use materials the index contrast of which is about 1 or even lower than 1.

Particular embodiments have just been described. Various variants and modifications will appear obvious to those skilled in the art. Thus, the emitting device 1 may comprise a plurality of VCSELs m that are identical but that have different specific emission patterns. To achieve this, the index-contrast gratings 20 associated with the VCSELs m have peripheral pads 25 the dimensions and/or arrangement of which are different from one another.

The invention claimed is:

1. A device for emitting a light beam, comprising:
   a vertical-cavity surface-emitting laser comprising a resonant cavity that extends along a main optical axis and that is bounded by two mirrors a top mirror of which defines an emission surface,
   the resonant cavity being configured to support a plurality of transverse optical modes, including a fundamental transverse mode and transverse modes of higher order having a rotational symmetry of order two about the main optical axis; and
   an index-contrast grating forming a diffusion lens, said grating being arranged on the emission surface and comprising a plurality of pads that are separate from one another and that are made of at least one material of a first refractive index, said pads being encircled by a medium of a second refractive index different from the first index, said pads including:
   a central pad, which is centered on the main optical axis, and
   a plurality of peripheral pads, which are periodically arranged along one or more lines that are concentric with respect to the central pad, and which are arranged so that the grating has, with respect to the main optical axis, a rotational symmetry of uneven order higher than or equal to three.

2. The device as claimed in claim 1, wherein, for a concentric line said to be of rank 1 arranged facing the central pad, a radial period is defined as being a distance along a radial axis between an external radial border of a peripheral pad with respect to a radial border of the central pad, and an azimuthal period is defined as being the period of the periodic arrangement of the peripheral pads along said concentric line of rank 1, the radial period and the azimuthal period being longer than or equal to λe/neff', where λe is the wavelength of the light beam generated by the laser and neff' is an effective index of a longitudinal mode of wavelength λe and guided by the grating.

3. The device as claimed in claim 2, comprising a concentric line said to be of rank 2 arranged so as to encircle the concentric line of rank 1, for which a radial period is defined as being a distance along a radial axis between an external radial border of a peripheral pad of the concentric line of rank 2 with respect to an external radial border of a peripheral pad of the concentric line of rank 1, and an azimuthal period is defined as being the period of the periodic arrangement of the peripheral pads along said concentric line of rank 2, the radial period and azimuthal period that are associated with the concentric line of rank 2 being longer than or equal to the radial period and azimuthal period that are associated with the concentric line of rank 1, respectively.

4. The device as claimed in claim 2, the radial period and azimuthal period that are associated with a concentric line of rank i being longer than or equal to the wavelength λe.

5. The device as claimed in claim 1, wherein the grating comprises at least two concentric lines said to be of rank 1 and 2, the peripheral pads of the concentric line of rank 2 being arranged so as to have an azimuthal offset with respect to the peripheral pads of the concentric line of rank 1.

6. The device as claimed in claim 5, wherein the peripheral pads of the concentric line of rank 2 are arranged in phase opposition with the peripheral pads of the concentric line of rank 1.

7. The device as claimed in claim 1, wherein the resonant cavity comprises a diaphragm defining an optical aperture a lateral dimension of which is larger than or equal to the wavelength $\lambda e$ of the light beam generated by the laser.

8. The device as claimed in claim 7, wherein the central pad has a lateral dimension larger than or equal to half, to within 10%, of a lateral dimension of the optical aperture.

9. The device as claimed in claim 7, wherein the central pad and the optical aperture have a circular shape.

10. The device as claimed in claim 1, wherein the index contrast between the first refractive index and the second refractive index is smaller than or equal to 1.

11. The device as claimed in claim 1, wherein the pads have a thickness equal to an uneven multiple of $\lambda e/(4 \cdot nH)$, where $\lambda e$ is the wavelength of the light beam generated by the laser and nH is the refractive index of the pads.

12. A process for fabricating the device as claimed in claim 1, comprising a step of wafer-scale production of a matrix array of lasers that are identical to one another, a step of conformal deposition of a passivation layer on the emission surface of the lasers, then a step of wafer-scale production of the index-contrast gratings by localized etching of the passivation layer.

* * * * *